United States Patent
Yin et al.

(10) Patent No.: US 9,973,081 B1
(45) Date of Patent: May 15, 2018

(54) LOW-POWER LOW-DUTY-CYCLE SWITCHED-CAPACITOR VOLTAGE DIVIDER

(71) Applicant: QUALCOMM Incorporated, San Diego, CA (US)

(72) Inventors: Wenjing Yin, San Diego, CA (US); Xuhao Huang, San Diego, CA (US); Sungmin Ock, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/680,105

(22) Filed: Aug. 17, 2017

(51) Int. Cl.
*H02M 3/07* (2006.01)
*H02M 1/08* (2006.01)

(52) U.S. Cl.
CPC ............... *H02M 3/07* (2013.01); *H02M 1/08* (2013.01)

(58) Field of Classification Search
CPC .......... H02M 1/08; H02M 1/088; H02M 3/06; H02M 3/07; H02M 3/155; H02M 3/156; H02M 3/158
See application file for complete search history.

(56) References Cited

U.S. PATENT DOCUMENTS

| | | | |
|---|---|---|---|
| 5,331,218 A * | 7/1994 | Moody | H03H 19/004 327/554 |
| 6,871,090 B1 | 3/2005 | He et al. | |
| 7,696,735 B2 | 4/2010 | Oraw et al. | |
| 8,427,113 B2 | 4/2013 | Xing et al. | |
| 8,503,203 B1 * | 8/2013 | Szczeszynski | H02M 3/073 307/110 |
| 8,693,224 B1 * | 4/2014 | Giuliano | H02M 3/07 363/60 |
| 8,710,903 B2 | 4/2014 | Oraw et al. | |
| 9,318,952 B2 | 4/2016 | Oraw et al. | |
| 2014/0239719 A1 * | 8/2014 | Kumar | H02M 3/07 307/31 |
| 2017/0063222 A1 * | 3/2017 | Teh | H02M 3/07 |

* cited by examiner

*Primary Examiner* — Matthew Nguyen
(74) *Attorney, Agent, or Firm* — Haynes and Boone, LLP (36340)

(57) ABSTRACT

A switched-capacitor voltage divider is provided that functions to divide an input voltage only while a low-duty-cycle clock pulse signal is asserted. All the switches in the switched-capacitor voltage divider are idle during an off time for the low-duty-cycle clock pulse signal.

20 Claims, 5 Drawing Sheets

LOW-POWER LOW-DUTY-CYCLE SWITCHED-CAPACITOR VOLTAGE DIVIDER

TECHNICAL FIELD

This application relates to voltage dividers, and more particularly to a low-power low-duty-cycle switched-capacitor voltage divider.

BACKGROUND

A resistive voltage divider is a conventional circuit for dividing an input voltage. But achieving low power consumption in a resistive voltage divider is problematic in that the resistors within the resistive voltage divider must be fairly robust (e.g., 2 MΩ) to reduce the current conducted to ground. The resulting oversizing of the resistors makes them less prone to semiconductor process variations as compared to active devices such as transistors. Moreover, resistors are commonly formed using considerably lower doping levels as compared to active devices such that a resistive voltage divider is typically robust to temperature variations. But the oversizing of the resistors lowers density in the resulting integrated circuit due to the die area needed to provide such robust resistances.

In contrast to the die area demands from resistive voltage dividers, a switched-capacitor voltage divider provides a more compact alternative. The capacitors in a switched-capacitor voltage divider are open circuits with respect to conducting DC current such that the capacitors need not be oversized to lower power consumption. A switched-capacitor voltage divider is thus advantageously dense as compared to a resistive voltage divider. However, the transistor switches in a switched-capacitor voltage divider consume substantial dynamic power.

Accordingly, there is a need in the art for an improved switched-capacitor voltage divider that retains its density advantages yet is low-power (e.g., less than 0.5 µA).

SUMMARY

A switched-capacitor voltage divider is provided that is responsive to a low-duty-cycle clock pulse signal. During the off time for the low-duty-cycle clock pulse signal, all the switches within the switched-capacitor voltage divider are idle. It is only during the assertion of the low-duty-cycle clock pulse signal that the switches are cycled through switching phases to divide an input voltage into a divided output voltage using a pair of voltage dividing capacitors. Accordingly, the resulting operation of the switched-capacitor voltage divider is very low power since no dynamic switching power is consumed during the bulk of the period (the off time) for the low-duty-cycle clock pulse signal.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A low-duty-cycle clock pulse signal activates a switched-capacitor voltage divider for low-power operation in the following disclosure. While the low-duty-cycle clock pulse signal is asserted, an input voltage such as a reference voltage charges an input node for an input capacitor. In addition, three switching phases are cyclically asserted during the assertion of the low-duty-cycle clock pulse signal. In a first one of the switching phases, a pair of voltage-dividing capacitors are discharged. In a second one of the switching phases, the pair of voltage-dividing capacitors are connected in series between ground and the input node. An intermediate node between the pair of voltage-dividing capacitors is thus charged to a divided version of the reference voltage during the second switching phase. In a third switching phase, the intermediate node is connected to an output node for an output capacitor while the voltage-dividing pair of capacitors are isolated from the input capacitor to charge the output node to the divided version of the reference voltage. During the off-time for the low-duty-cycle pulse, the input node is isolated from the voltage source and from the pair of voltage-dividing capacitors. Similarly, the intermediate node is isolated from the output node during the off time for the low-duty-cycle pulse.

Figure 1:
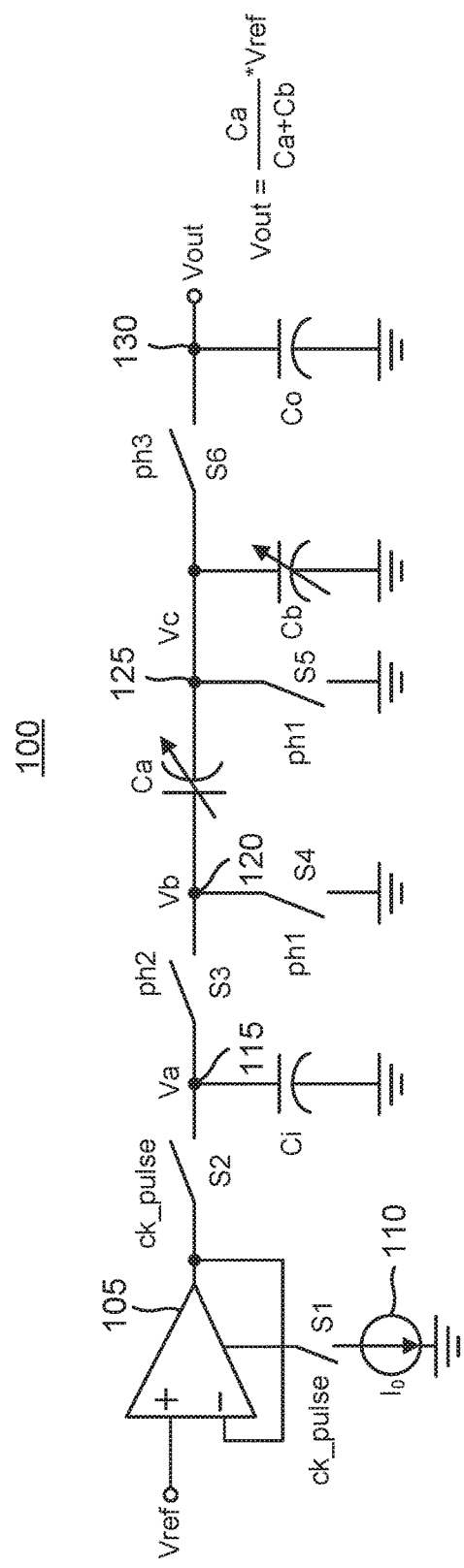
FIG. 1 is a circuit diagram of a low-duty-cycle switched-capacitor voltage divider in accordance with an aspect of the disclosure.

The resulting switched-capacitor voltage divider is quite advantageous because the off time comprises the bulk of the switching period for the low-duty-cycle pulse. For example, the off time may be 98% of the switching period in some embodiments. Since there are no switching activities and power consumption during the off time, the resulting operation of the low-duty-cycle switched-capacitor voltage divider is very low power such as a consumption of just 0.5 µA or less. Turning now to the drawings, an example switched-capacitor voltage divider 100 is shown in FIG. 1. A differential amplifier 105 functions as an input voltage source. A positive input for differential amplifier 105 receives a reference voltage Vref whereas an output for differential amplifier 105 is tied to its negative input. The resulting negative feedback through differential amplifier 105 keeps its output voltage equal to the reference voltage.

To reduce power consumption, a current source 110 that powers differential amplifier 105 is connected to a power node for differential amplifier 105 through a switch S1 that is controlled to be closed during the on time (pulse assertion) for a low-duty-cycle clock pulse signal (ck_pulse). The output node for differential amplifier 105 connects through a switch S2 to an input node 115 for an input capacitor Ci that couples between input node 115 and ground. Like switch S1, switch S2 is controlled to be closed only while the low-duty-cycle clock pulse signal ck_pulse is asserted.

Switched-capacitor voltage divider 100 also includes a pair of voltage dividing capacitors formed by a first voltage dividing capacitor Ca in series with a second voltage dividing capacitor Cb through an intermediate node 125. First voltage dividing capacitor Ca connects between an input node 120 and intermediate node 125 whereas second voltage dividing capacitor Cb connects between intermediate node 125 and ground. To provide a tuning ability for the voltage division by switched-capacitor voltage divider 100, first voltage dividing capacitors Ca may be a variable capacitor in some embodiments. Second voltage dividing capacitor Cb may also be a variable capacitor in embodiments in which a tuning ability is desired for the voltage division by switched-capacitor voltage divider 100. A switch S3 couples between input node 115 and input node 120 whereas a switch S4 couples between input node 120 and ground. Analogous to switch S4, a switch S5 connects between intermediate node 125 and ground. Another switch S6 connects between intermediate node 125 and an output node 130. Finally, an output capacitor Co connects between output node 130 and ground.

During the off time for low-duty-cycle clock pulse signal ck_pulse, switches S3 through S6 are open just like switches S and S2. In contrast to switches S1 and S2, switches S3 through S6 are not simply closed during the assertion of the low-duty-cycle clock pulse signal ck_pulse. Instead, which of the switches in the set of switches S3 through S6 that are closed during the on time for low-duty-cycle clock pulse signal ck_pulse depends upon a switching phase. In particular, the on time for low-duty-cycle clock pulse signal ck_pulse is divided into three non-overlapping switching phases that are repeated serially during the on time. During a first switching phase (ph1), switches S4 and S5 in the set of switches S3 through S6 are the only ones closed. During a second switching phase (ph2), it is just switch S3 that is closed in the set of switches S3 through S6. Finally, during a third switching phase (ph3), it is just switch S6 that is closed in the set of switches S3 through S6. The resulting configuration of switched-capacitor voltage divider 100 during these three switching phases will be discussed further below. Since the set of switches S3 through S6 are active during the switching phases, these switches may also be designated as voltage divider switches. Switches S1 through S6 may all comprise transistor switches.

Figure 2:
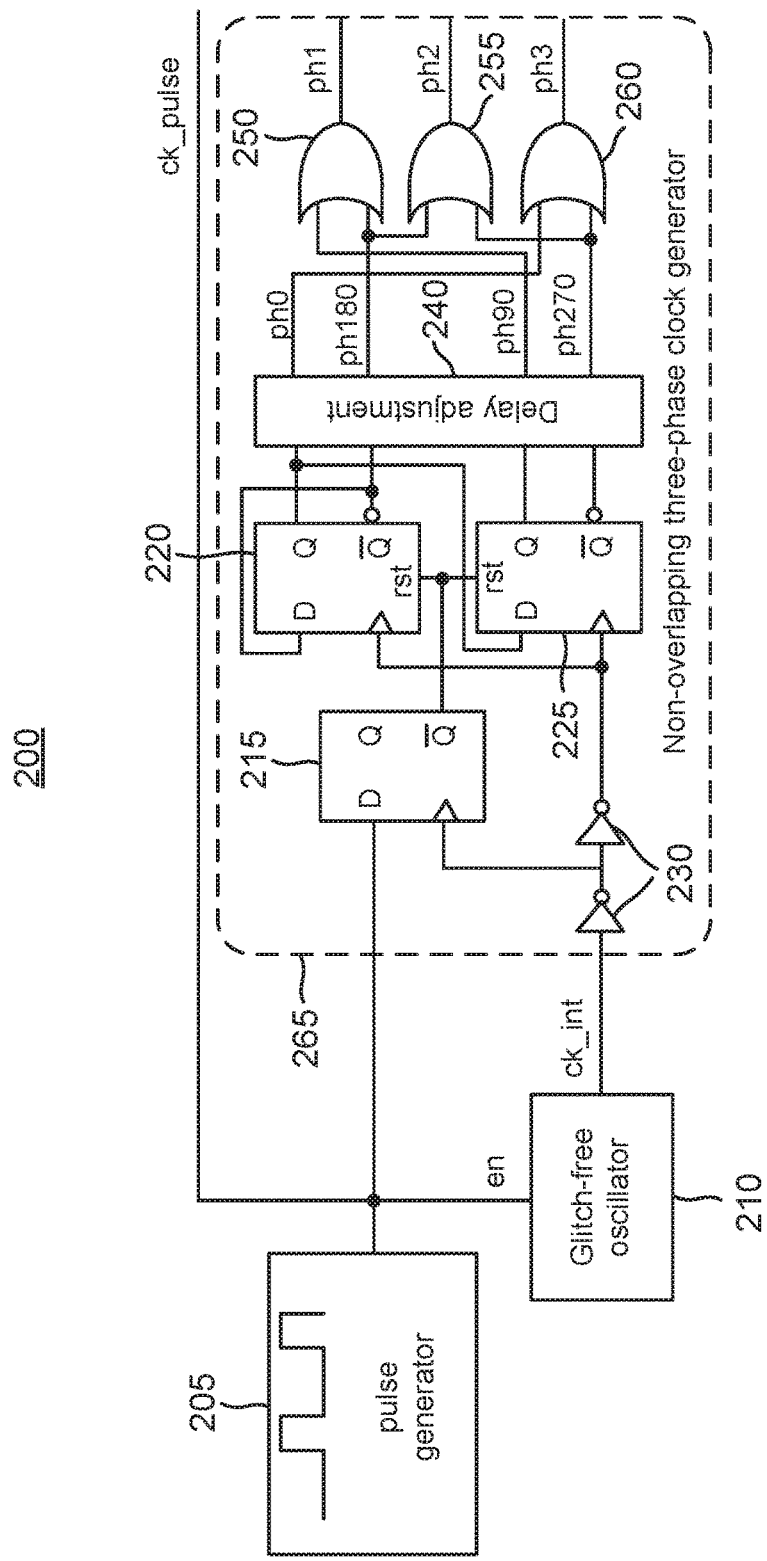
FIG. 2 is a circuit diagram for a clock generator for the low-duty-cycle switched-capacitor voltage divider of FIG. 1 in accordance with an aspect of the disclosure.
Figure 3:
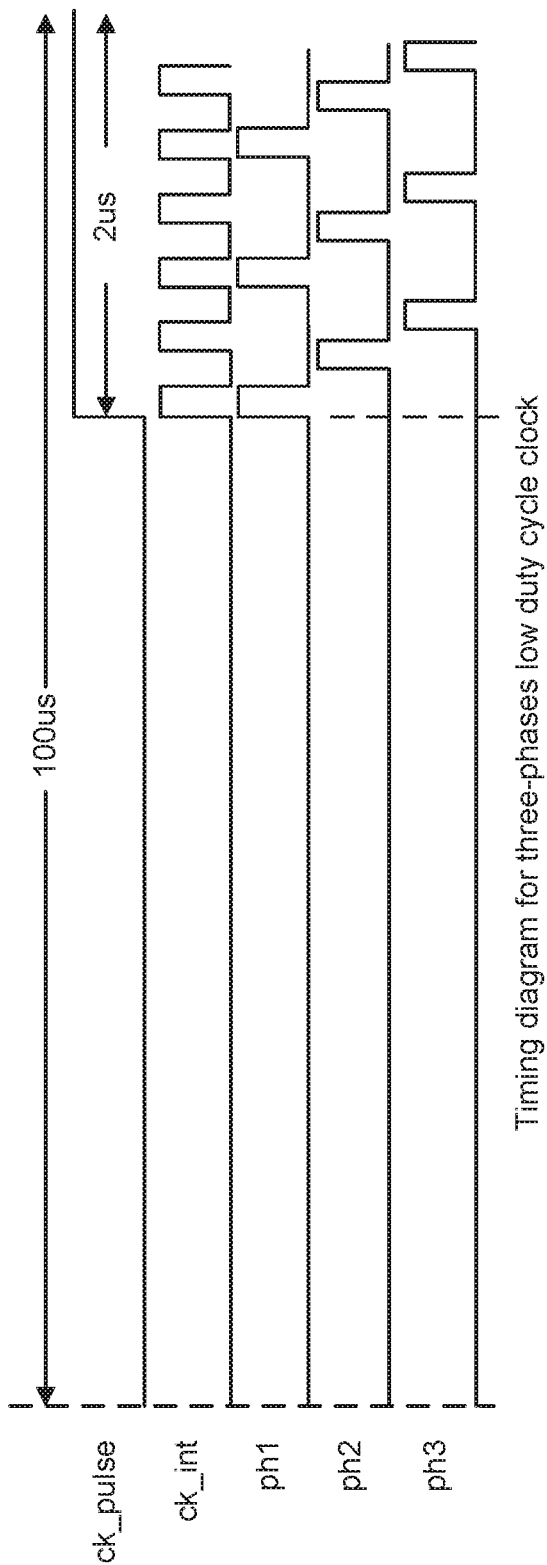
FIG. 3 is a timing diagram for the various clock pulses produced by the clock generator of FIG. 2 in accordance with an aspect of the disclosure.

The three switching phases may be non-overlapping in some embodiments. Each switching phase may be activated by its own non-overlapping clock pulse. For example, a clock pulse signal ph1 is asserted during the first switching phase. Similarly, a clock pulse signal ph2 is asserted during the second switching phase whereas a clock pulse signal ph3 is asserted during the third switching phase. An example clock generator 200 for the generation of the low-duty-cycle clock pulse signal and the non-overlapping clock pulse signals ph1, ph2, and ph3 is shown in FIG. 2. A pulse generator 205 generates the low-duty clock pulse signal ck_pulse. A timing diagram for an example low-duty-cycle clock pulse signal ck_pulse is shown in FIG. 3. In this example, the period for the low-duty-cycle clock pulse signal ck_pulse is 100 but it will be appreciated that different periods may be used in alternative embodiments. Since pulse generator 205 is a low-duty-cycle pulse generator, the duty cycle for low-duty-cycle clock pulse signal ck_pulse will be less than 50%. In the example of FIG. 3, the duty cycle is 2% but it will be appreciated that other low duty cycles that are less than 50% may be used in alternative embodiments. While the low-duty-cycle clock pulse signal ck_pulse is asserted, a glitch-free oscillator 210 is enabled to generate an oscillating clock signal ck_int. The period of clock signal ck_int is less than $\frac{1}{3}^{rd}$ of the on time for the low-duty-cycle clock pulse signal ck_pulse. For example, the period of clock signal ck_int may be 100 ns in an embodiment in which the on time for the low-duty-cycle clock pulse signal ck_pulse is 2 μs.

The low-duty-cycle clock pulse signal ck_pulse and the clock signal ck_int drive non-overlapping three-phase clock generator 265. In particular, the low-duty-cycle clock pulse signal ck_pulse drives a D input for a flip-flop 215 that is clocked by an inverted version of the clock signal ck_int as produced by a first inverter 230. A second inverter 230 inverts the inverted version of the clock signal ck_int to clock a flip-flop 220 and a flip-flop 225. A Q bar output from flip-flop 215 resets flip-flops 220 and 225. A Q bar output from flip-flop 220 serves as its data input D. The Q output from flip-flop 220 drives the data input D of flip-flop 225. The resulting Q and Q bar outputs from flip-flop 220 form an in-phase (ph0) and an inverted version (ph180) of the clock signal ck_int, respectively. Similarly, the resulting Q and Q bar outputs from flip-flop 225 form a 90° shifted (ph90) and a 270° shifted version (ph270) of the clock signal ck_int, respectively. A delay adjustment circuit 240 corrects for any non-idealities in the phased clock signals ph0, ph90, ph180, and ph270 to drive an OR gate 250, an OR gate 255, and an OR gate 260. In particular, OR gate 250 ORs the ph90 and ph180 clock signals to produce the clock pulse signal ph1 for the first switching phase. Similarly, OR gate 255 ORs the ph180 and the ph270 clock signals to produce the clock pulse signal ph2 for the second switching phase. Finally, OR gate 260 ORs the ph0 and the ph270 clock signals to produce clock pulse signal ph3 for the third switching phase. As shown in FIG. 3, the pulse widths for the clock pulse signals ph1, ph2, and ph3 is approximately the same as the pulse width for the clock signal ck_int. Clock pulse signal ph1 is pulsed first, followed by clock pulse signal ph2. Since the pulses are non-overlapping a brief delay separates the clock pulse ph1 and ph2. Similarly, a brief delay separates the pulsing of clock pulse signal ph3 from the pulsing of clock pulse signal ph2. The consecutive pulsing of clock pulse signals ph1, ph2, and ph3 continues while the low-duty-cycle clock pulse signal ck_pulse is asserted. In one embodiment, non-overlapping three phase clock generator 265 may be deemed to form a means for cyclically asserting the first clock pulse signal ph1, the second clock pulse signal ph2, and the third clock pulse signal ph3 during the on time for the low-duty-cycle clock pulse signal ck_pulse.

Figure 4:
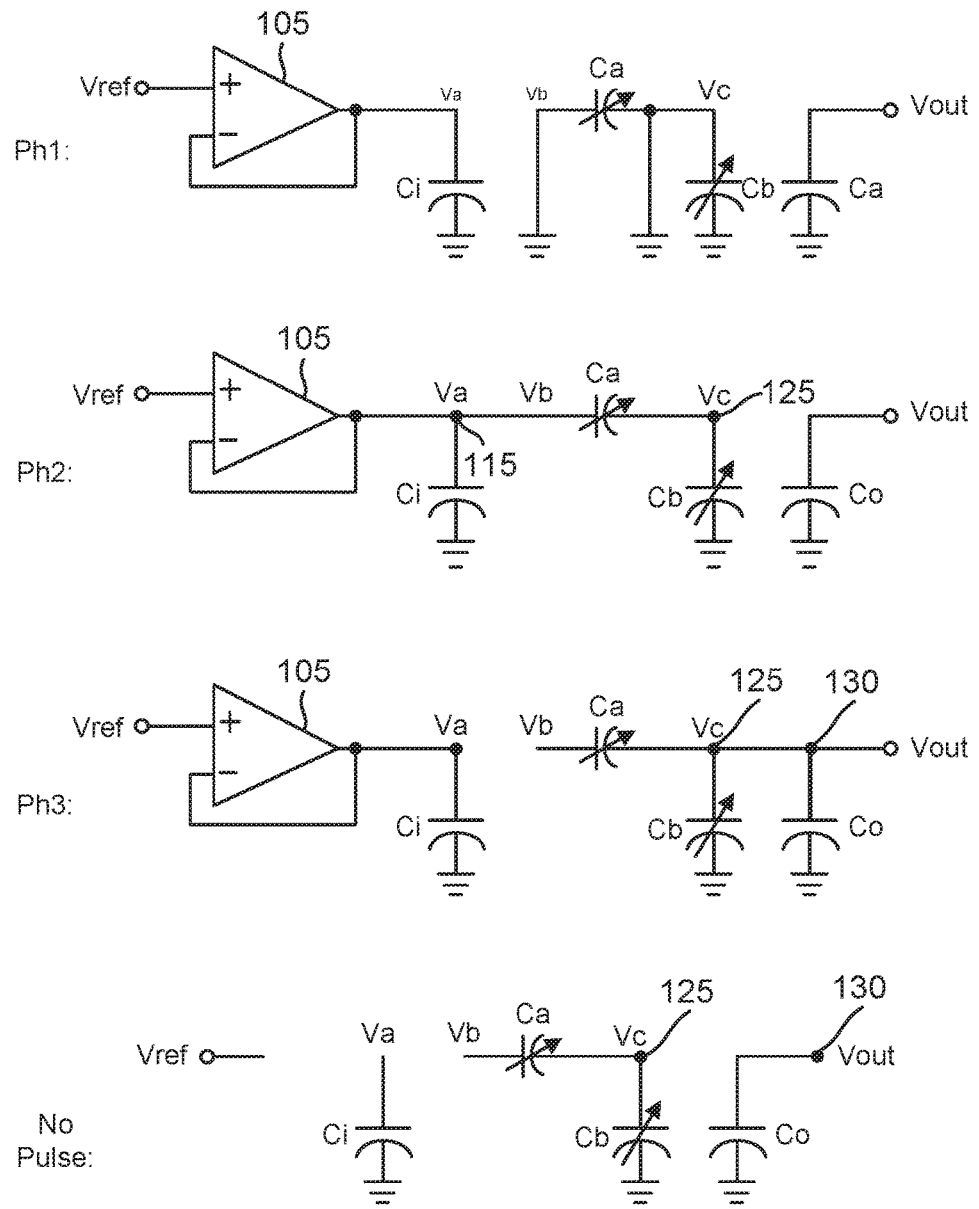
FIG. 4 illustrates the configurations for the low-duty-cycle switched-capacitor voltage divider of claim 1 in the three switching phases and also in the no pulse state in accordance with an aspect of the disclosure.

The resulting configuration for switched-capacitor voltage divider 100 during switching phase ph1 is shown in FIG. 4. As discussed with regard to FIG. 1, switches S4 and S5 are closed while switches S3 and S6 are open during the first switching phase. Note that both terminals for each of the voltage dividing capacitors Ca and Cb are connected to ground during switching phase ph1. This discharge of voltage dividing capacitors Ca and Cb ensures that no leftover charge remains on them to pollute the ensuing voltage division.

Referring again to FIG. 1, switch S3 is closed during the second switching phase (ph2) while switches S4, S5, and S6 are opened. The resulting configuration for switched-capacitor voltage divider 100 during phase ph2 is also shown in FIG. 4. During first switching phase ph1, differential amplifier 105 charged input node 115 to a voltage Va that equals the reference voltage. Since voltage dividing capacitors Ca and Cb are connected in series between input node 115 and ground during the second switching phase ph2, intermediate node 125 between voltage dividing capacitors Ca and Cb is charged to a divided version of the reference voltage during this switching phase. In particular, the divided version of the reference voltage equals a ratio of a capacitance Ca for voltage dividing capacitor Ca to a total capacitance (Ca+Cb) times the reference voltage, where Cb is a capacitance for voltage dividing capacitor Cb. In this fashion, a voltage Vc for intermediate node 125 is charged to a divided voltage (Ca/(Ca+Cb))*Vref during the second switching phase.

Referring again to FIG. 1, switch S6 is closed while switches S3, S4, and S5 are opened during the third switching phase ph3. The resulting configuration for switched-capacitor voltage divider 100 during third switching phase ph3 is also shown in FIG. 4. An output voltage Vout on output node 130 is charged to the divided voltage (Ca/(Ca+Cb))*Vref during the third switching phase. The off time for the low-duty-cycle clock pulse signal pulse ref is designated as "No Pulse" in FIG. 4. The input capacitor Ci is isolated from differential amplifier 105 and from voltage dividing capacitor Ca. Similarly, intermediate node 125 is isolated from output node 130 during the off time.

Figure 5:
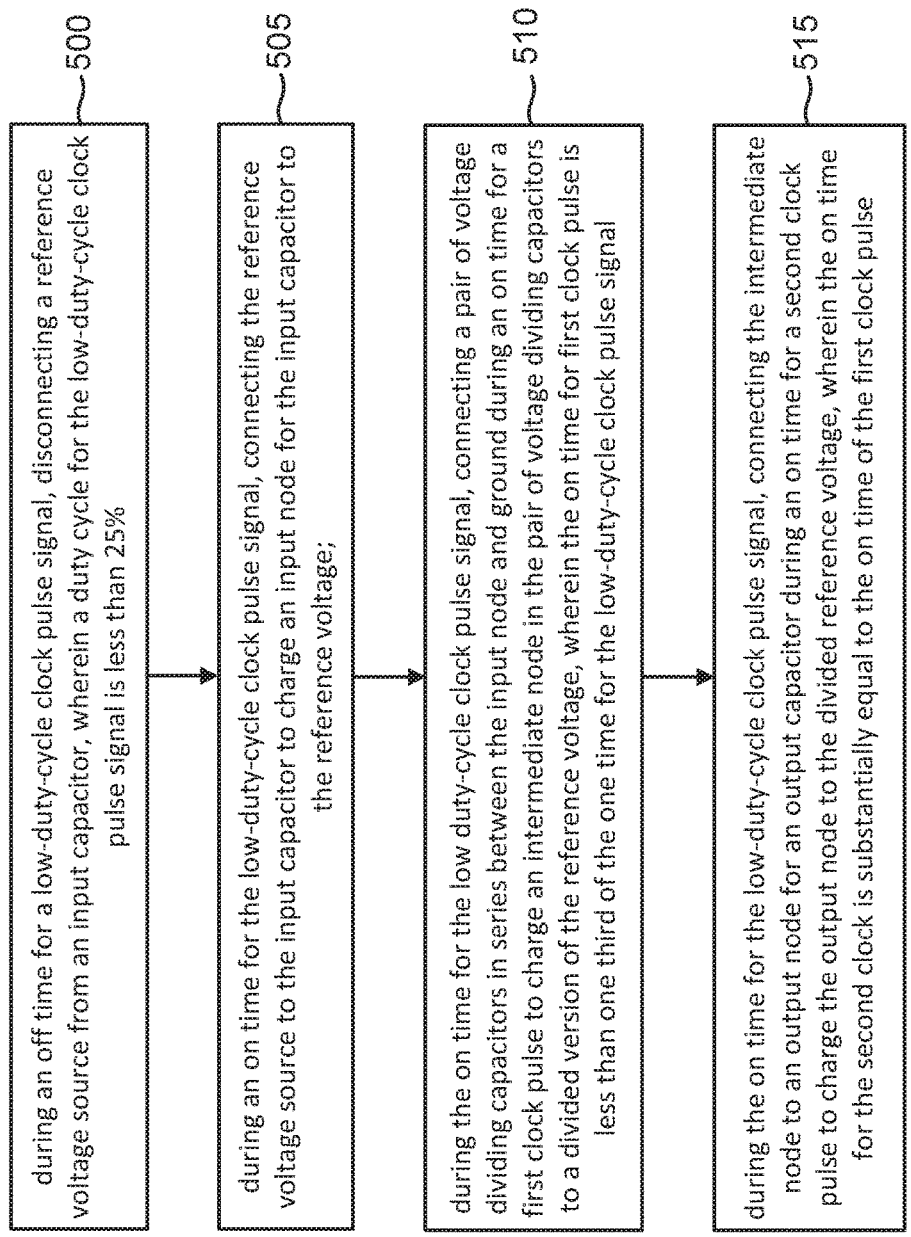
FIG. 5 is a flowchart for a method of operation for a low-duty-cycle switched-capacitor voltage divider in accordance with an aspect of the disclosure.

A method of operation for a low-duty-cycle switched-capacitor voltage divider will now be discussed with reference to the flowchart of FIG. 5. The method includes an act 500 of, during an off time for a low-duty-cycle clock pulse signal, disconnecting a reference voltage source from an input capacitor. The opening of switch S2 while the low-duty-cycle clock pulse signal ck_pulse is low is an example of act 500. In addition, the method includes an act 505 of, during an on time for the low-duty-cycle clock pulse signal, connecting the reference voltage source to the input capacitor to charge an input node for the input capacitor to the reference voltage. The closing of switch S2 while the low-duty-cycle clock pulse signal ck_pulse is asserted is an example of act 505. The method further includes an act 510 of, during the on time for the low duty-cycle clock pulse signal, connecting a pair of voltage dividing capacitors in series between the input node and ground during an on time for a first clock pulse signal to charge an intermediate node in the pair of voltage dividing capacitors to a divided version of the reference voltage. The closing of switch S3 in response to the assertion of the second clock pulse signal ph2 is an example of act 510. Finally, the method includes an act 515 of, during the on time for the low-duty-cycle clock pulse signal, connecting the intermediate node to an output node for an output capacitor during an on time for a second clock pulse signal to charge the output node to the divided reference voltage. The closing of switch S6 in response to the assertion of the third clock pulse signal ph3 is an example of act 515.

It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A switched-capacitor voltage divider, comprising:
an input voltage source for providing an input voltage;
an input capacitor;
an input switch configured to couple the input voltage source to the input capacitor to charge the input capacitor to the input voltage during an assertion of a low-duty-cycle clock pulse signal;
a pair of voltage dividing capacitors;
an output capacitor; and
a plurality of voltage divider switches coupled to the pair of voltage dividing capacitors and the output capacitor, wherein the plurality of voltage divider switches are responsive to a first clock pulse signal during the assertion of the low-duty-cycle clock pulse signal to couple the pair of voltage dividing capacitors to the input capacitor to charge an intermediate node in the pair of voltage dividing capacitors to a divided version of the input voltage, and wherein the plurality of voltage divider switches are further responsive to a second clock pulse signal during the assertion of the low-duty-cycle clock pulse signal to couple the intermediate node to the output capacitor to charge the output capacitor to the divided version of the input voltage.

2. The switched-capacitor voltage divider of claim 1, wherein the plurality of voltage divider switches are further responsive to a third clock pulse signal during the assertion of the low-duty-cycle clock pulse signal to discharge the pair of voltage dividing capacitors.

3. The switched-capacitor voltage divider of claim 2, wherein the plurality of voltage divider switches includes:
a first switch coupled between an input node to the pair of voltage dividing capacitors and ground; and
a second switch coupled the intermediate node and ground, and wherein the first switch and the second switch are both configured to close responsive to an assertion of the third clock pulse signal during the assertion of the low-duty-cycle clock pulse signal.

4. The switched-capacitor voltage divider of claim 3, wherein the plurality of voltage divider switches comprises a third switch coupled between the input node to the pair of voltage dividing capacitors and the input capacitor, and wherein the third switch is configured to close responsive to an assertion of the first clock pulse signal during the assertion of the low-duty-cycle clock pulse signal.

5. The switched-capacitor voltage divider of claim 4, wherein the plurality of voltage divider switches further comprises a fourth switch coupled between the intermediate node and the output capacitor, and wherein the fourth switch is configured to close responsive to an assertion of the second clock pulse signal during the assertion of the low-duty-cycle clock pulse signal.

6. The switched-capacitor voltage divider of claim 5, wherein the first clock pulse signal, the second clock pulse signal, and the third clock pulse signal are all non-overlapping clock pulse signals.

7. The switched-capacitor voltage divider of claim 6, further comprising:
a clock source configured to provide the low-duty-cycle clock pulse signal, the first clock pulse signal, the second clock pulse signal, and the third clock pulse signal.

8. The switched-capacitor voltage divider of claim 7, wherein the clock source comprises a pulse generator configured to generate the low-duty-cycle clock pulse signal.

9. The switched-capacitor voltage divider of claim 8, wherein the clock source further comprises an oscillator and a non-overlapping three-phase clock generator, wherein the non-overlapping three-phase clock generator is configured to cyclically assert the third clock pulse signal, the first clock pulse signal, and the second clock pulse signal responsive to oscillations from the oscillator, wherein the oscillator is configured to oscillate during the assertion of the low-duty-cycle clock pulse signal.

10. The switched-capacitor voltage divider of claim 1, wherein the pair of voltage dividing capacitors are a pair of variable capacitors.

11. The switched-capacitor voltage divider of claim 1, wherein the input switch and the plurality of voltage dividing switches are all transistor switches, and wherein a duty cycle for the low-duty-cycle clock pulse signal is 2%.

12. A method of dividing an input voltage in a switched-capacitor voltage divider, comprising:
during an off time for a low-duty-cycle clock pulse signal, disconnecting an input voltage source from an input capacitor;
during an on time for the low-duty-cycle clock pulse signal, connecting the input voltage source to the input capacitor to charge an input node for the input capacitor to the input voltage;
during the on time for the low duty-cycle clock pulse signal, connecting a pair of voltage dividing capacitors in series between the input node and ground during an on time for a first clock pulse to charge an intermediate node in the pair of voltage dividing capacitors to a divided version of the input voltage; and
during the on time for the low-duty-cycle clock pulse signal, connecting the intermediate node to an output node for an output capacitor during an on time for a second clock pulse to charge the output node to the divided version of the input voltage.

13. The method of claim 12, further comprising:
during the on time for the low-duty-cycle clock pulse signal, discharging the pair of voltage dividing capacitors responsive to an assertion of a third clock pulse signal.

14. The method of claim 13, further comprising cyclically asserting the third clock pulse signal, the first clock pulse signal, and the second clock pulse signal to be non-overlapping clock pulse signals during the on time for the low-duty-cycle clock pulse signal.

15. The method of claim 12, further comprising:
adjusting a capacitance for each capacitor in the pair of voltage dividing capacitors to adjust the divided version of the input voltage.

16. The method of claim 12, further comprising:
generating the input voltage in a differential amplifier to equal a reference voltage during the on time of the low-duty-clock pulse signal.

17. The method of claim 12, wherein a duty cycle of the low-duty-cycle clock pulse signal is 2%.

18. A switched-capacitor voltage divider, comprising:
a reference voltage source;
an input capacitor;
an input switch connected between the reference voltage source and an input node for the input capacitor, wherein the input switch is configured to close during an on time for a low-duty-cycle clock pulse signal and to open during an off time for the low-duty-clock pulse signal;
a first voltage dividing capacitor in series with a second voltage dividing capacitor through an intermediate node;
a first switch connected between an input node for the first voltage dividing capacitor and the input node for the input capacitor, wherein the first switch is configured to close during an on time for a first clock pulse signal and to open during an off time for the first clock pulse signal;
an output capacitor;
a second switch connected between the intermediate node and the output capacitor, wherein the second switch is configured to close during an on time for a second clock pulse signal and to open during an off time for the second clock pulse signal; and
means for cyclically asserting the first clock pulse and the second clock pulse during the on time for the low-duty-cycle clock pulse signal.

19. The switched-capacitor voltage divider of claim 18, further comprising:
a third switch connected between the input node to the first voltage dividing capacitor and ground; and
a fourth switch connected between the intermediate node and ground, wherein the third switch and the fourth switch are both configured to close during an on time for a third clock pulse signal and to open during an off time for the third clock pulse signal, and wherein the means is further configured to cyclically assert the third clock pulse signal during the on time for the low-duty-cycle clock pulse signal.

20. The switched-capacitor voltage divider of claim 19, wherein the means is further configured to cyclically assert the first clock pulse signal, the second clock pulse signal, and the third clock pulse signal so as to be non-overlapping clock pulse signals.

* * * * *